(12) United States Patent
Garuti et al.

(10) Patent No.: US 9,595,930 B2
(45) Date of Patent: Mar. 14, 2017

(54) SOLID STATE MICROWAVE GENERATOR AND POWER AMPLIFIER

(71) Applicant: MKS Instruments, Inc., Andover, MA (US)

(72) Inventors: Marco Garuti, Reggio Emilia (IT); Marco Morresi, Giove (IT); Roberto Cupello, Castel Viscardo (IT); Paolo Balocchi, Reggio Emilia (IT); Claudio Botti, Fogliano (IT); Francesco Garuti, Reggio Emilia (IT)

(73) Assignee: MKS INSTRUMENTS, INC., Andover, MA (US)

( * ) Notice: Subject to any disclaimer, the term of this patent is extended or adjusted under 35 U.S.C. 154(b) by 0 days.

(21) Appl. No.: 14/732,114

(22) Filed: Jun. 5, 2015

(65) Prior Publication Data

US 2016/0359460 A1    Dec. 8, 2016

(51) Int. Cl.
*H03F 3/21* (2006.01)
*H03F 3/195* (2006.01)
(Continued)

(52) U.S. Cl.
CPC .............. *H03F 3/211* (2013.01); *H01P 1/36* (2013.01); *H01P 5/18* (2013.01); *H03F 3/195* (2013.01); *H03F 3/602* (2013.01); *H03F 2200/204* (2013.01); *H03F 2200/405* (2013.01); *H03F 2200/408* (2013.01); *H03F 2200/451* (2013.01); *H03F 2203/21142* (2013.01)

(58) Field of Classification Search
USPC ......................... 330/124 R, 295, 84, 286, 53
See application file for complete search history.

(56) References Cited

U.S. PATENT DOCUMENTS 3,986,147 A    10/1976   Carter et al.
5,613,197 A  *  3/1997   Copeland .............. H03D 7/163
                                                         455/11.1
(Continued)

FOREIGN PATENT DOCUMENTS

EP    2 690 779    1/2014

OTHER PUBLICATIONS

International Search Report and Written Opinion for PCT/US2016/031851 dated Jul. 28, 2016.
(Continued)

*Primary Examiner* — Hieu Nguyen
(74) *Attorney, Agent, or Firm* — Foley & Lardner LLP; James De Vellis (57) ABSTRACT

A microwave generator and power amplifier system for the same are provided. The power amplifier system can include a first power amplifier unit that can receive an input power signal and can provide an output power signal. A power splitter unit can receive the output power signal and can generate a plurality of split power input signals. The split power input signals can be received by a second power amplifier unit that can provide a plurality of split power output signals. At least one isolator unit that can couple at least part of the second power amplifier unit with a power combiner unit. The power combiner unit can receive the plurality of split power output signals from the second power amplifier unit via the at least one isolator unit and can combine the plurality of split power output signals into a unified power output.

22 Claims, 5 Drawing Sheets

(51) Int. Cl.
*H01P 1/36*   (2006.01)
*H01P 5/18*   (2006.01)
*H03F 3/60*   (2006.01)

(56) References Cited

U.S. PATENT DOCUMENTS

| | | | | |
|---|---|---|---|---|
| 5,793,253 | A * | 8/1998 | Kumar | H03F 1/3252 |
| | | | | 330/124 D |
| 6,831,511 | B2 * | 12/2004 | Hollingsworth | H03F 1/30 |
| | | | | 330/124 R |
| 8,723,618 | B2 * | 5/2014 | Hirota | H03F 3/211 |
| | | | | 333/125 |
| 2003/0215373 | A1 | 11/2003 | Reyzelman et al. | |
| 2015/0351164 | A1 * | 12/2015 | Wesson | H05B 6/686 |
| | | | | 219/756 |

OTHER PUBLICATIONS

Kanto et al., "An X-band 250W Solid-State Power Amplifier using GaN Power HEMTs," IEEE, 2008, 77-80.

Kwack, Ju-Young et al., "1kW S-band Solid State Radar Amplifier," Wireless and Microwave Technology Conference, 2011 IEEE 12th Annual, Apr. 18, 2011.

* cited by examiner

SOLID STATE MICROWAVE GENERATOR AND POWER AMPLIFIER

BACKGROUND

Power amplifier apparatuses can utilize magnetron or other vacuum tubes to achieve an amplified power output relative to power input. Such devices can be fragile and have a limited life.

SUMMARY

At least one aspect is directed to a power amplifier system. The power amplifier system can include a first power amplifier unit that can receive an input power signal and can provide an output power signal. The output power signal has a higher power than the input power signal. The power amplifier system can include a power splitter unit that can receive the output power signal from the first power amplifier unit and can generate a plurality of split power input signals. The power amplifier system can include a second power amplifier unit that can receive the plurality of split power input signals. The second power amplifier unit can include a plurality of power amplifiers. Each of the plurality of power amplifiers of the second power amplifier unit can receive one of the plurality of split power input signals and can provide one of a plurality of split power output signals. The power amplifier system can include at least one isolator unit that can couple at least one of the plurality of power amplifiers of the second power amplifier unit with a power combiner unit. The power combiner unit can receive the plurality of split power output signals from the second power amplifier unit via the at least one isolator unit and can combine the plurality of split power output signals into a unified power output. The unified power output can have a frequency of between 2.0 GHz and 3.0 GHz.

In some implementations, the directional coupler can receive the unified power output from the power combiner unit. The directional coupled can also provide the unified power output as output of the power amplifier system. The first power amplifier unit can include three power amplifier devices. For example, the first power amplifier unit can include at least two power amplifiers connected to each other in series. The power amplifier system can be part of a Radio Frequency (RF) microwave generator.

In some implementations, the power splitter unit includes a first power splitter device coupled to both a second power splitter device and a third power splitter device. The first power splitter device can receive the output power signal from the first power amplifier unit. The second power splitter device can provide a first of the plurality of split power output signals to a first of the plurality of power amplifiers of the second power amplifier unit, and can provide a second of the plurality of split power output signals to a second of the plurality of power amplifiers of the second power amplifier unit. The third power splitter device can provide a third of the plurality of split power output signals to a third of the plurality of power amplifiers of the second power amplifier unit, and can provide a fourth of the plurality of split power output signals to a fourth of the plurality of power amplifiers of the second power amplifier unit.

In some implementations, the first power amplifier unit includes exactly three power amplifier devices configured in series, the power splitter unit includes exactly three power splitter devices, the second power amplifier unit includes exactly four power amplifiers configured in parallel, the at least one isolator unit includes exactly four isolator devices, and the power combiner unit includes exactly three power combiner devices. In some implementations, the power amplifier system is disposed in a shielded metal case, the shielded metal case having a fluid cooling channel. In some implementations, the unified power output is at least 800 W and has a frequency of between 2.40 GHz and 2.50 GHz. The plurality of split output power signals can include exactly four split output power signals that are substantially in phase with one another. The power combiner unit can include a polytetrafluoroethylene (PTFE) element at least partially defining a chamber, and a conductor element disposed at least in part in the chamber. The power combiner unit can be electrically coupled with an output connector and the power combiner unit can be disposed at least in part proximate to a cooling plate.

In some implementations, the first power amplifier unit receives the input power signal and provides the output power signal. The power splitter unit can receive the output power signal from the first power amplifier unit and can generate the plurality of split power input signals. The second power amplifier unit can receive the plurality of split power input signals and can provide the one of the plurality of split power output signals. The at least one isolator unit can couple the at least one of the plurality of power amplifiers of the second power amplifier unit with the power combiner unit. The power combiner unit can receive the plurality of split power output signals from the second power amplifier unit via the at least one isolator unit and can combine the plurality of split power output signals into the unified power output.

At least one aspect is directed to a microwave generator unit having a power amplifier system. The power amplifier system can include a first power amplifier unit that can receive an input power signal and provide an output power signal. The power amplifier system can include at least one power splitter unit that can receive the output power signal from the first power amplifier unit and that can generate a plurality of split power input signals. The power amplifier system can include a second power amplifier unit having four power amplifier devices that can receive the plurality of split power input signals. Each of the four power amplifier devices of the second power amplifier unit can receive one of the plurality of split power input signals and can provide one of a plurality of split power output signals. The power amplifier system can include at least one isolator unit that can couple at least one of the plurality of power amplifiers of the second power amplifier unit with a power combiner unit. The power combiner unit can receive the plurality of split power output signals from the second power amplifier unit via the at least one isolator unit and can combine the plurality of split power output signals into a unified power output. The unified power output can have a power of substantially (e.g., +/−25%) 1 kW and a frequency of between 2.40 GHz and 2.50 GHz.

In some implementations, the microwave generator includes a power supply module having a phase lock loop module configured to generate the input power signal. The first power amplifier unit can receive the input power signal from the phase lock loop module. The microwave generator can include a case having a fluid cooling channel, a power supply module, a user interface, a RF digital synthesizer, and an RF output socket.

At least one aspect is directed to a method of providing microwave frequency range output power from a solid state power amplifier system. The method can include receiving, by a first power amplifier unit, an input power signal. The method can include providing, by the first power amplifier unit, an output power signal. The output power signal can have higher power than the input power signal. The method can include receiving, by a power splitter unit, the output power signal from the first power amplifier unit, and generating, by the power splitter unit, a plurality of split power input signals. The method can include receiving, by a second power amplifier unit, the plurality of split power input signals. The second power amplifier unit can include a plurality of power amplifiers. Each of the plurality of power amplifiers of the second power amplifier unit can receive one of the plurality of split power input signals and can provide one of a plurality of split power output signals. The method can include coupling, by at least one isolator unit, at least one of the plurality of power amplifiers of the second power amplifier unit with a power combiner unit. The method can include receiving, by the power combiner unit, the plurality of split power output signals from the second power amplifier unit via the at least one isolator unit. The method can include combining, by the power combiner unit, the plurality of split power output signals into a unified power output having a frequency of between 2.0 GHz and 3.0 GHz.

In some implementations, the method includes providing the unified power output as output from a microwave generator. The method can also include providing the solid state power amplifier system in a case having a fluid cooling channel. In some implementations, the plurality of power amplifiers of the second power amplifier unit includes exactly four power amplifiers, and the method include providing the four power amplifiers in a parallel configuration and electrically coupled between the power splitter unit and the at least one isolator unit.

At least one aspect is directed to a power amplifier system. The power amplifier system can include means for receiving an input power signal and for providing an output power signal. The output power signal can have higher power than the input power signal. The power amplifier system can include means for receiving the output power signal and for generating a plurality of split power input signals. The power amplifier system can include means for receiving the plurality of split power input signals and for providing a plurality of split power output signals. The power amplifier system can include means for coupling at least one of the plurality of power amplifiers of the second power amplifier unit. The power amplifier system can include means for receiving the plurality of split power output signals from the second power amplifier unit via the at least one isolator unit and for combining the plurality of split power output signals into a unified power output. The unified power output can have a frequency of between 2.0 GHz and 3.0 GHz.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification.

BRIEF DESCRIPTION OF THE DRAWINGS

The accompanying drawings are not intended to be drawn to scale. Like reference numbers and designations in the various drawings indicate like elements. For purposes of clarity, not every component may be labeled in every drawing. In the drawings.

DETAILED DESCRIPTION

The various concepts introduced above and discussed in greater detail below may be implemented in any of numerous ways. Use of the term "substantially" or other similar terms of degree with reference to a number, unit, magnitude or value such as a power level, frequency, length, or phase indicates a range of +/−25% from any identified number, unit, magnitude, length or value. While "substantially" may not always be explicitly stated, examples herein referencing specific power levels (by number) in watts, milliwatts, or decibel-milliwatts (dBm), or referencing specific frequencies, frequency ranges, impedances, or phase characteristics, include both the specific power level, frequency, range, impedance, or phase degree (i.e., +/−5%), as well as a range of +/−25% from any identified power level, frequency, range, or phase degree.

Systems and methods of the present disclosure generally relate to a solid state power amplifier system for a microwave generator. The power amplifier system can provide, for example, output power of substantially 1 kW (+/−25%) in the microwave frequency range of 2.40 GHz-2.50 GHz. The power amplifier system can include a first power amplifier unit that receives an input power signal. The first power amplifier unit can include, for example, three power amplifier devices (e.g., transistors) configured in series.

The output power signal from the first power amplifier unit can be provided to a power splitter unit that can generate, for example, four split power input signals that can be of substantially equal power and in phase with each other. The four (or other number) of split power input signals can be provided to a second power amplifier unit. For example, the second power amplifier unit can include four power amplifiers (e.g., transistors) and each of the four power amplifiers can receive one of the four split power input signals and can generate one of four substantially equal (+/−25%) and substantially in phase (+/−25%) split power output signals.

The split power output signals can be provided from the second power amplifier unit to a power combiner unit, for example via at least one isolator unit. The power combiner unit can combine, or couple together the four (or other number of) split power output signals into a unified power output of, for example, substantially 1 kW and having a microwave frequency range of, for example, substantially 2.450 GHz. The power combiner unit can include a chamber at least partially defined or surrounded by a polytetrafluoroethylene (PTFE) foil or other insulating material. A copper conducting element can be disposed (e.g., suspended) at least partially within the chamber. PTFE or other insulating material can form supports that fix the copper conducting element in position in the chamber, for example in position in the chamber at an equal distance from the surrounding internal surfaces, i.e. the electrical ground of the power amplifier system, while the copper conducing element carries the microwave energy at a higher voltage potential.

The power amplifier system can be part of a microwave generator unit. For example, the power amplifier system can include at least one component or device disposed within a case having electrical shielding characteristics and a fluid cooling channel. The cooling channel (or other heat sink) can be disposed, at least in part, proximate to the combiner unit or the isolator unit, among other components, to disperse heat. The microwave generator unit can also include or couple to one or more power supply modules user interfaces, input sockets, or output sockets.

Figure 1:
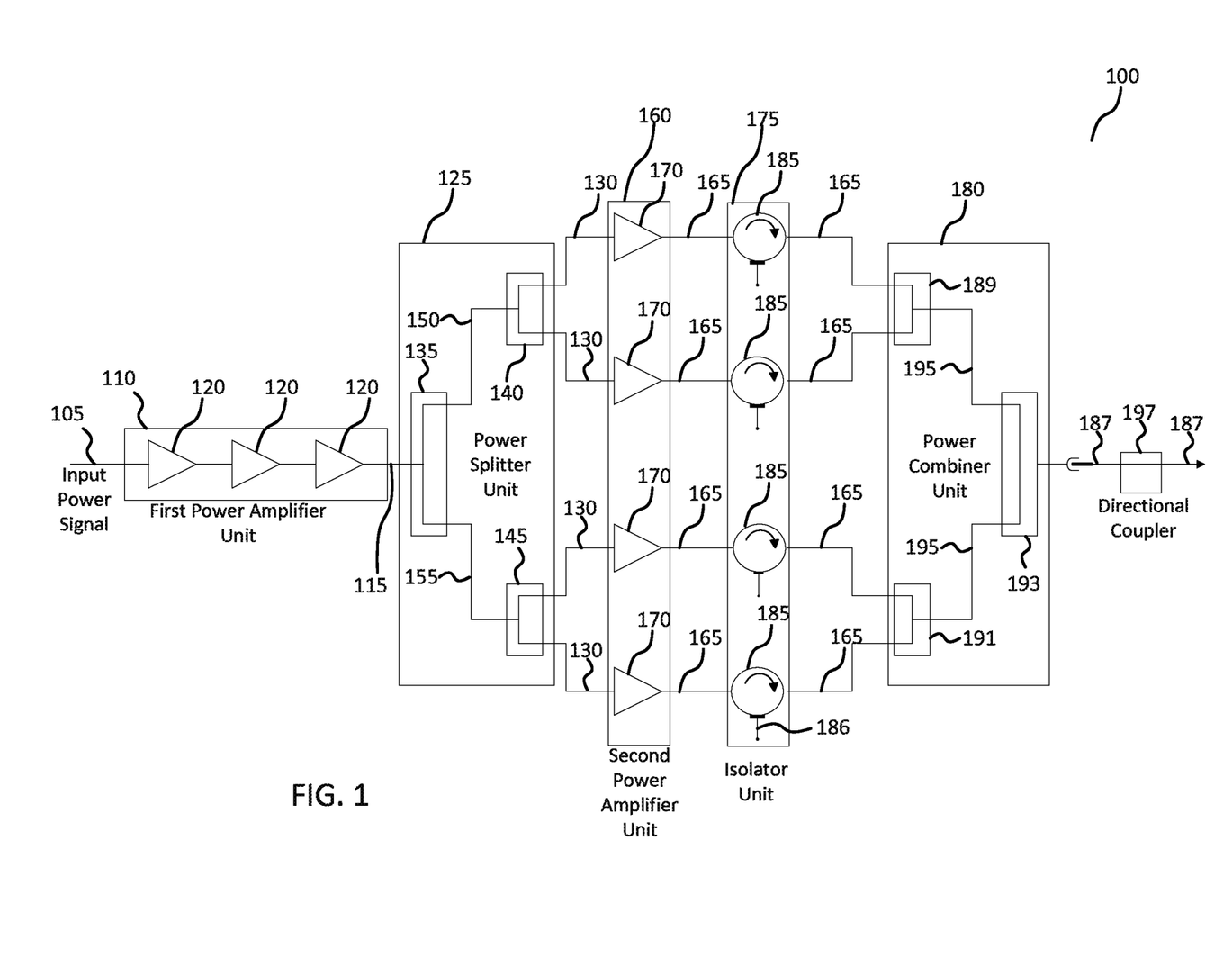
FIG. 1 depicts an example power amplifier system in accordance with at least one implementation.

FIG. 1 depicts an example power amplifier system 100. The power amplifier system 100 can include at least one solid state power amplifier system or device that for example utilizes transistors or other solid state devices rather than magnetron or vacuum tubes to achieve an amplified power output relative to a power input. The power amplifier system 100 can be part of a microwave generator such as a Radio Frequency (RF) microwave generator. For example, the power amplifier system 100 can achieve a unified power output of substantially (e.g., +/−25%) 1 kW or more in the microwave frequency range in an ISM band of, for example between 2.4 GHz and 2.5 GHz with an energy efficiency conversion AC>RF of at least 40%.

The power amplifier system 100 can receive at least one input power signal 105, for example from an external input power module. The input power signal can be, for example, 1 mW (0 dBm). At least one first power amplifier unit 110 can receive the input power signal 105, and can provide an output power signal 115. The output power signal 115 can be higher power than the input power signal 105. For example, the first power amplifier unit 110 can receive an input power signal 105 of 1 mW (0 dBm) and can provide the output power signal 115 of 35.5 W (45.5 dBm).

The first power amplifier unit 110 can include at least one power amplifier device 120 such as a transistor. The power amplifier devices 120 can include a mix of signal amplifier integrated circuit and power transistors in a cascade configuration, that operate at high frequency with low losses and signal distortion, that provide sufficient power to the gate drive of at least one second power amplifier unit 160.

In some implementations the first power amplifier unit 110 includes three power amplifier devices (e.g., transistors) 120 configured in series. The power amplifier devices 120 can individually and collectively amplify the input power signal 105. For example, a first power amplifier device 120 can receive the input power signal 105 of 1 mW (0 dBm) and provide an output power of 6.3 mW (8 dBm). A second power amplifier device 120 can receive the 6.3 mW power signal as input an amplify this power to provide an output of 631 mW (28 dBm). A third power amplifier device 120 can receive the 631 mW power signal as input an amplify this power to provide the output power signal 115 of 35.5 W (45.5 dBm).

The power amplifier devices 120 of the first power amplifier unit 110 can be a same type of transistor (or other power amplifier device) or different types of transistors from each other. The first power amplifier unit 110 can include any number of power amplifier devices 120 based on the size or power amplification properties of the transistors or based on the level of the input power signal 105. For example, the first power amplifier unit 110 can include between one and nine transistors or other power amplifier devices 120. In some implementations the power amplifier unit 110 includes at least two power amplifier devices 120 connected to each other in series. When the first power amplifier unit 110 includes more than one power amplifier device 120, the power amplifier devices 120 can be arranged in series, parallel, or in other configurations.

The power amplifier system 100 can include at least one power splitter unit 125. The power splitter unit 125 can receive the output power signal 115 (e.g., from the first power amplifier unit 110) and can generate at least one split power input signal 130. For example, the power splitter unit 125 can include three power splitter devices such as a first power splitter device 135, a second power splitter device 140, and a third power splitter device 145. These devices can be independent devices or different parts of one power splitter device such as a one to four power splitter device. The first power splitter device 135 can receive, from the first power amplifier unit 110 as input, the power signal 115 and can provide a first internal power input 150 to the second power splitter device 140 and can also provide a second internal power input 155 to the third power splitter device 145. From the first internal power input 150, the second power splitter device 140 can generate two split power input signals 130, and from the second internal power input 155 the third power splitter device 145 can generate two split power input signals 130. The split power input signals 130 can be substantially equal to one another in terms of power, phase, or amplitude. For example, each split power input signal 130 can have a power level of substantially 7.2 W (38.6 dBm) and can be substantially in phase (e.g., +/−25%) with one another.

The split power input signals 130 can have a lower power than the output power signal 115. For example, due to power losses incurred during splitting of the power signal by the power splitter unit 125, the output power signal 115 (received as input by the power splitter unit 125) can be 35.5 W (45.5 dBm) and each of four split output power signals 130 can be 7.2 W (38.6 dBm). The power splitter unit 125 can include at least one Wilkinson type splitter assembled on a printed circuit board through a combination of copper paths having a thickness, width, and length designed to minimize losses and achieve impedance matching between the output of the first power amplifier unit 125 and the input of the second power amplifier unit 160.

The power amplifier system 100 can include at least one second power amplifier unit 160. The second power amplifier unit 160 can receive at least one split power input signal 130 and provide at least one split power output signal 165. The second power amplifier unit 160 can include a plurality of power amplifiers 170. For example, each power amplifier 170 can be or include at least one transistor or other solid state device. In some implementations, the second power amplifier unit 160 includes four power amplifiers 170. The four power amplifiers 170 can be configured in parallel, for example. The second power amplifier unit 160 can include other numbers of power amplifiers 170 as well, such as two, three, six, eight, or other number of power amplifiers 170. Any number of power amplifiers 170 can be configured in parallel. Each of the power amplifiers 170 of the second power amplifier unit 160 can receive one of the plurality split power input signals 130 as input and can generate or provide one of the plurality of split power output signals 165 as output.

For example, one of the power amplifiers 170 can receive one of the split power input signals 130 having a power level of 7.2 W (38.6 dBm) and can provide one of the split power output signals 165 having a power level of 229 W (53.6 dBm). Each of the split power output signals 165 can have the same or substantially the same characteristics. For example the second power amplifier unit 160 can include four power amplifiers 170 that each provide one of a total of four split power output signals 165. The four split power output signals 165 can be substantially in phase, and can have substantially the same amplitude and substantially the same power. For example, the split power output signals 165 can have a power level of substantially 229 W (53.6 dBm) for each split power output signal 165. The four (or other number of) power amplifiers 170 can be different transistors or other devices, having different power amplification or other characteristics relative to the three (or other number of) power amplifier devices 120. The power amplifiers 170 and the power amplifier devices 120 can be different types of transistors or the same type of transistor. The power amplifiers 170 can maintain the phase relationship (e.g., substantially in phase) as the split power output signals 165 are provided as output from the power amplifiers 170. The power amplifiers 170 can be suitable for ISM band application, for example at the microwave band frequency. For example, the power amplifiers 170 (e.g., transistors) can operate at 2.45 GHz, with an output power between 100 W and 500 W, with a gain between 10 dB and 20 dB and an efficiency of at least 55%. The power amplifiers 170 can include a case, such as a ceramic case or plastic case.

In some configurations, given a maximum power capability for a single power amplifier device 120 or power amplifier 170, such as 250 W, four power amplifier devices 170 can be arranged in parallel to obtain collective output power of 1000 W (250 W×four power amplifier devices equals a total of 1000 W). In some examples each power amplifier device 170 can have a 400 W or substantially 400 W capability. A series configuration can be used to repeatedly amplify a signal to obtain the maximum power from a single power amplifier device. For example, the power amplifier devices 120 can be arranged in series where a 1 mW input signal 105 can be amplified to 6.3 mW, then to 630 mW, then to 35.5 W at output power signal 115. In this example, one fourth of the 35.5 W output signal 115 (about 8 W) can be provided as split power input signals 130 to each of four power amplifiers 170 arranged in parallel. Each 8 W split power input signal 130 can be amplified to one of four substantially 230 W split power output signals 165 that can be combined to provide unified power output 187.

In some implementations, the first power splitter device 135 receives the output power signal 115 from the first power amplifier unit 120 and provides the first internal power input 150 to the second power splitter device 140. The second power splitter device 140 can provide a first of the plurality of split output power signals 130 to a first of the plurality of power amplifiers 170, and can provide a second of the plurality of split power output signals 130 to a second of the plurality of power amplifiers 170. The third power splitter device 145 can provide a third of the plurality of split power output signals 130 to a third of the plurality of power amplifiers 170, and can provide a fourth of the plurality of split power output signals 130 to a fourth of the plurality of power amplifiers 170.

The power amplifier system 100 can include at least one isolator unit 175 and at least one power combiner unit 180. The isolator unit 175 can generally provide unidirectional microwave or radio frequency (RF) power from the second power amplifier unit 160 (or individual power amplifiers 170 thereof) to at least one power combiner unit 180. This can shield the second power amplifier unit 160, the power splitter unit 125, or the first power amplifier unit 110 from adverse effects associated with load mismatch conditions. The isolator unit 175 can couple at least one of the power amplifiers 170 with the power combiner unit 180. For example, the isolator unit 175 can electrically connect at least one power amplifier 170 of the second power amplifier unit 160 with at least one component of the power combiner unit 180 to provide power from the second power amplifier unit 160 to the power combiner unit 180. In some implementations, the isolator unit 175 has four isolator devices 185, and each of the four isolator devices 185 can couple one of the power amplifiers 170 with the power combiner unit 180. Each isolator device 185 can have a dedicated dummy load port 186 coupled to a dummy load. The isolator unit 175 can include one isolator device 185 for each power amplifier 170. For example, a power amplifier system 100 having two power amplifiers 170 can also have two isolator devices 185.

In some implementations, the isolator devices 185 are circulators that have three ports. For example, the isolator device 185 can include an input port to receive the split power output signal 165 from the second power amplifier unit 160, an output port to provide the split power output signal to the power combiner unit 180, and a dummy load port 186. The dummy load port 186 can carry a load of, for example, 50 ohms and can absorb and dissipate reverse power (e.g., as heat) from the isolator device 185, for example during reverse power conditions in a continuous mode of operation. The isolator devices 185 can be assembled on a printed circuit board that can electrically couple components of the power amplifier system 100 with each other. The isolator unit 175 and the power combiner unit 180 can provide a directivity of greater than 20 dB so that, for example reverse power does not substantially affect forward power characteristics. In some implementations, the directivity is greater than 30 dB. The isolator devices 185 can also include two port or four port devices.

The isolator unit 175 can provide the split power output signals 165 from the second power amplifier unit 160 to the power combiner unit 180. During this transmission via the isolator unit 175 some power loss may occur. For example, a split power output signal 165 received as input by an isolator device 185 can have a power level of 229 W (53.6 dBm) and the split power output signal 165 output by the same isolator device 185 can have a power level of 209 W (53.2 dBm). For an isolator unit 175 having more than one isolator device 185, the split power output signals 165 received by and provided from the isolator devices 185 can have the same (i.e., +/−5%) or substantially the same (i.e., +/−25%) characteristics, such as frequency, phase, amplitude, or power characteristics. The isolator devices 185 can include at least one drop in case circulator having three ports. The terminals of the ports can be welded or electrically connected to a printed circuit board. The isolator devices 185 can achieve an IN-OUT isolation of greater than 20 dB and can operate under unitary power conditions of at least 300 W. The isolator devices 185 can include a three port waveguide component utilizing ferrite technology to selectively direct energy to a specific port based on the direction of wave propagation. One port (e.g., the third port) that receives the reverse power re-entering the isolator device 185 can be connected to at least one dummy load 186 in the form of a printed resistor that can dissipate energy from the reverse power.

The power combiner unit 180 can receive one or more split power output signals 165 from the isolator unit 175 or from the second power amplifier unit 160 via the isolator unit 175. The power combiner unit 180 can combine the received multiple split power signals 165 into a unified power output 187. For example, a four to one power combiner unit 180 can receive, from isolator unit 175 output, four split power output signals 165 each having a power level of 209 W (53.2 dBm), and can combine the four split power output signals 165 into a unified power output having a power level of 813 W (59.1 dBm). In this example, 813 W can be considered substantially 1 KW. In some implementations the power level of the unified power output is at least 750 W (58.8 dBm).

The unified power output 187 can have a frequency in the microwave range. For example, the frequency of the unified power output 187 can be between 2.0 and 3.0 GHz. In some implementations, the unified power output 187 frequency is at least 2.0 GHz, or between 2.40 GHz and 2.50 GHz at a power level of at least 800 W. In some implementations, the power of the unified power output 187 is greater than 500 W. The power amplifier system 100 can amplify the input power signal 105 of 1 mW (0 dBm) to produce the unified power output 187 of up to 1 KW (60 dBm), +0.5/−1.0 dBm over the frequency range from 2.4 GHz to 2.5 GHz. For example, the unified power output 187 can range from 59.0 dBm to 60.5 dBm, or from 0.794 kW to 1.122 kW at any frequency from 2.4 GHz to 2.5 GHz, inclusive. The frequency of the unified power output 187 can include the 915 MHz or the 5 GHz bands. The frequency of the unified power output 187 can range between 800 MHz and 10 GHz. In one implementation the frequency of the unified power output 187 is between 900 MHz and 6000 MHz.

The power amplifier system 100 can include exactly four, more or fewer than four split power output signals 165, and exactly four, more or fewer than four power amplifiers 170 or isolator devices 175. In some implementations, each pair of one power amplifier 170 and one isolator device 175 receives as input and provides as output one split power output signal 165. In examples with four isolator devices 175 that provide four split power output signals 165 to the power combiner unit 180, the power combiner unit 180 can include a first power combiner device 189, a second power combiner device 191, and a third power combiner device 193. The first power combiner device 189 and the second power combiner device 191 can each receive as input two split power output signals 165, and can each provide an internal power signal 195 as output to the third power combiner device 193. In this example, the third power combiner device 193 receives two internal power signals 195 as input. The third power combiner device 193 can combine the two (or other number) of internal power signals 195 into the unified power output 187.

In some implementations, the power combiner unit 180 can be a single unit, and the power combiner devices 189, 191, 193 can be subcomponents of the power combiner unit 180 rather than discrete individual devices. The power combiner unit 180 can include exactly three, or more or fewer than three power combiner devices, and need not be configured in the two tier arrangement as in the example of FIG. 1. For example, the power combiner unit 180 can include seven power combiner devices in a three tier arrangement where four power combiner devices in a first tier each receive two (of a total of eight) split power output signals 165, and combine each pair of two split power signals into one (of a total of four) internal power signals 195. Two of the four internal power signals 195 can be provided to each of two second tier power combiner devices, that each combine their respective pair of internal power signals 195 and output a total of two internal power signals 195 that are provided to a single third tier power combiner device, that combines them to provide the unified power output 187.

The power amplifier system 100 can include at least one directional coupler 197. The directional coupler 197 can receive the unified power output 187 from the power combiner unit 180 and can provide the unified power output 187 as output of the power amplifier system 100. The directional coupler 197 can couple power to an output port in a unidirectional manner so that the unified power output 187 can be provided as output from the power amplifier system 100 and so that power entering the directional coupler 197, e.g., via the output port, is isolated. In this example, such backpower entering the directional coupler 197 can be isolated and not received by the power combiner unit 180 or other components of the system 100 at a level high enough to damage the power amplifier system 100 components. Some losses can be associated with the directional coupler 197. For example, the unified power output 187 provided to the directional coupler 197 can have a power level of 813 W (59.1 dBm), and the unified power output 187 provided from the directional coupler 197 can have a power level of 794 W (59.0 dBm).

In some implementations, the power amplifier system 100 has physical length and width dimensions of substantially 400 mm×400 mm and is substantially 51 mm (2 inches) in height. In one implementation, the length is 370 mm, the width is 360 mm, and the height is 45 mm.

Figure 2:
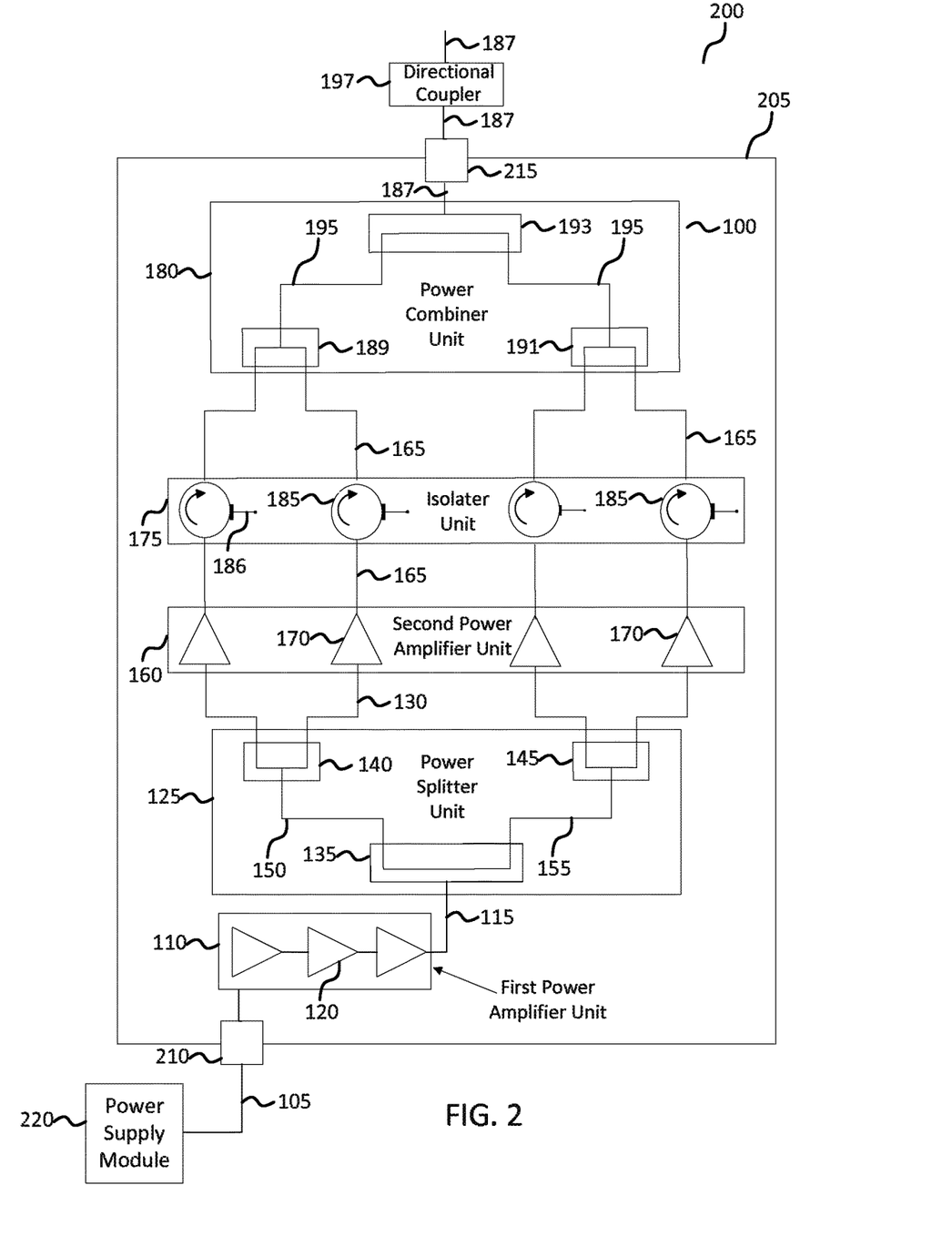
FIG. 2 depicts an example top view of a microwave generator unit including a power amplifier system in accordance with at least one implementation.

FIG. 2 depicts an example top view of a microwave generator unit 200 including schematic representations of components of the power amplifier system 100. The microwave generator unit 200 can include at least one case 205. The case 205 can house or enclose the power amplifier system 100. The case 205 can be a metal case, and can be shielded, or provide or act as a shield, to at least partially protect components of the power amplifier system 100 or other components external to the microwave generator unit 200. The microwave generator unit 200 can have dimensions of 102 mm×102 mm×483 mm, or 4 inches×4 inches×19 inches, and the 19 inch surface can include a front or display panel. In some implementations, the microwave generator unit 200 can be disposed in or part of a cabinet or rack having a length of 510 mm, a width of 440 mm, and a height of 82 mm. The dimensions in this example include, or are sufficient to house, the generator unit 200, power amplifier system 100, and the power supply module 220.

In the example of FIG. 2, a top portion or cover of the case 205 has been removed to provide a representation in schematic form of the components of the power amplifier system 100. The microwave generator unit 200 can include at least one input connector 210 and at least one output connector 215. The input connector 210 can include a plug or interface to receive the input power signal 105 and to provide the input power signal 105 to components of the power amplifier system 100 such as the first power amplifier unit 110. The input connector 210 can receive the input power signal 105 of, for example 1 mW (0 dBm) from at least one power supply module 220. The power supply module 220 can include a phase lock loop module or circuit that can generate the input power signal 105. The input power signal 105 can be stable in frequency and stable against ambient or background temperature changes. The first power amplifier unit 110 can receive the input power signal 105 from the power supply module 220, for example via the input connector 210. For example, a coaxial cable can connect the power supply module 220 with the input connector 210. The power supply module 220 can include a radio frequency (RF) digital synthesizer or other RF signal source that generates the input power signal 105. The power supply module 220 can be separate from the microwave generator unit 200 or separate from the other components of the power amplifier system 100 such as the first power amplifier unit 110 or the second power amplifier unit 160. For example, the power supply module 220 can be part of a computing device having a central processing unit configured to control a time frame to change frequency of the input power signal 105 at single digit millisecond intervals (rather than a time frame of over 100 ms), or to implement an autotune capability with an automatic frequency shift.

The output connector 215 can include an RF output socket, RF connector, 7/16 DIN connector, plug or interface to receive the unified power output 187 and provide the same as output from the microwave generator unit 200. The directional coupler 197 can be coupled to the output connector 215 to receive the unified power output as output from the output connector 215, or can be disposed within the case 205 electrically coupled between the power combiner unit 180 and the output connector 215. In some implementations, the power combiner unit 180 can be electrically coupled with the output connector 215. The microwave generator unit 200 can also include at least one user interface (e.g., on a font or side panel of the case 205) and at least one RF digital synthesizer.

Figure 3:
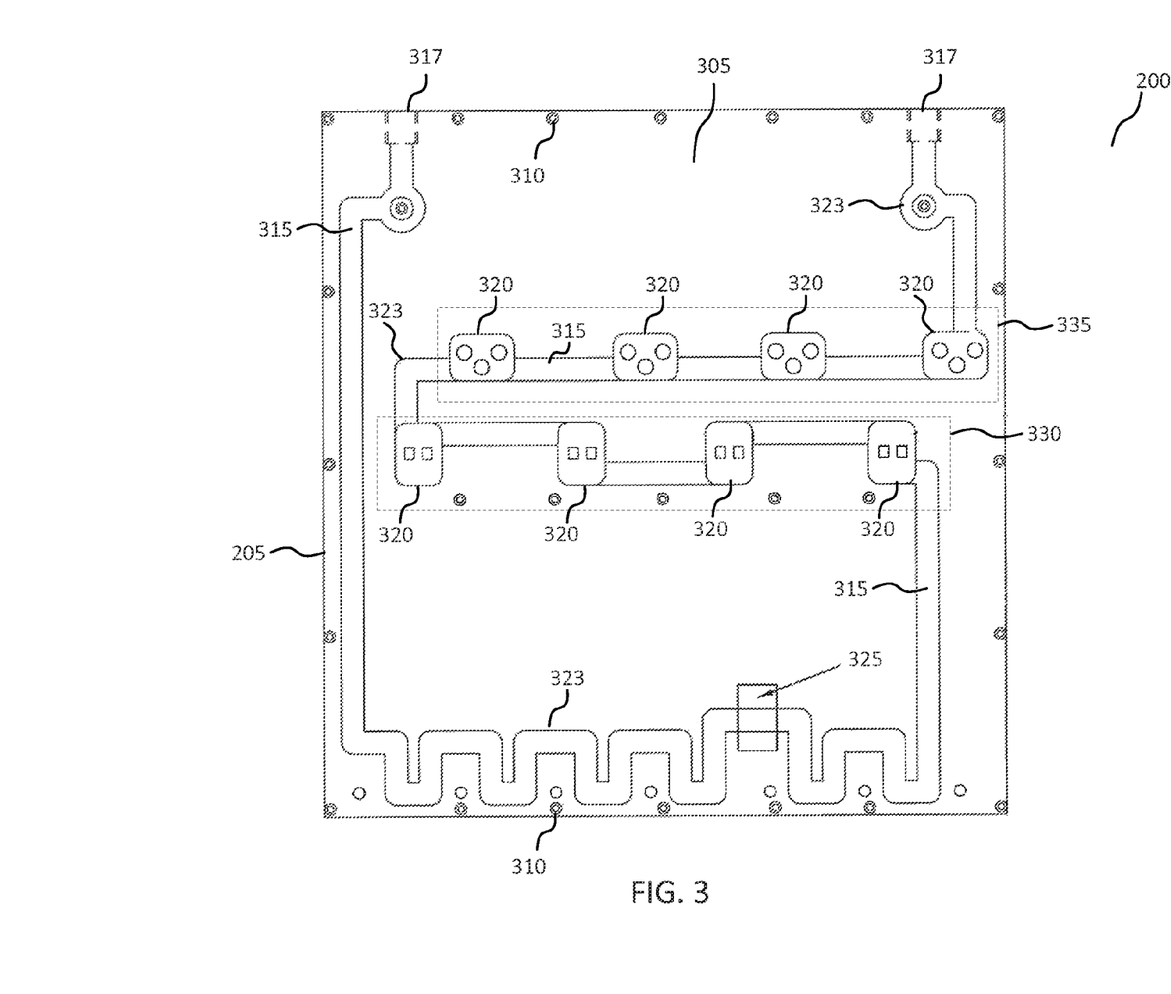
FIG. 3 depicts an example bottom view of a microwave generator unit in accordance with at least one implementation.

FIG. 3 depicts an example bottom view of the microwave generator unit 200. The bottom panel 305 and other portions of the case 205 can be fastened or connected together to form the case 205 using one or more fasteners or rivets 310 (or other fastening means such as spot welds, adhesive connections, latches, screws, or snap to fit components, for example). A bottom panel or portion 305 of the case 205 can include at least one fluid cooling channel 315. The fluid channel 315 can include a channel, tunnel or tube integrated into the case 205. Water or other fluid such as a coolant can flow through or stand in the fluid channel 315 to disperse heat from components of the power amplifier system 100. The case 205 (or bottom panel 305) can include at least one cooling plate 320. The cooling plate 320 can be part of the fluid cooling channel 315 or a component independent from the fluid cooling channel 315. The fluid cooling channel 315 can be made from aluminum, for example and can have at least one fluid port 317 to control the entry, removal, or flow of fluid within the fluid cooling channel 315.

The fluid cooling channels 315 can be configured on or as part of the case 205 in a location that passes as close as possible to areas of maximum heat flow dissipation from components of the power amplifier system 100, such as across the power amplifiers 170 or portions of the isolator devices 185 susceptible to heating such as dummy load areas. The fluid cooling channels 315 can include curves, internal ridges, turns, or course changes 323 as to introduce turbulence in water or other fluid disposed in or flowing through the fluid cooling channel 315. The turbulence can improve heat dissipation via the fluid cooling channel 315 from components of the power amplifier system 100.

For example, the case 205 (or bottom panel 305) can include a first cooling area 325 located on a portion of the bottom panel 305 proximate to the first power amplifier unit 110 (or power amplifier devices 120 thereof). The case 205 (or bottom panel 305) can also include a second cooling area 330 to, for example, dissipate heat from the second power amplifier unit 160 or power amplifiers 170 thereof. The case 205 (or bottom panel 305) can also include a third cooling area 335 to, for example, dissipate heat from at least one dummy load port 186 of at least one isolator device 185 or other portion of the isolator unit 175. The first cooling area 325, second cooling area 330, and third cooling area 335 can each include portions of one or more fluid cooling channel 315 or of cooling plates 320.

The power combiner unit 180 or other components of the power amplifier system 100 such as the power amplifier devices 120 or the power amplifiers 170 can be disposed at least in part proximate to at least one fluid cooling channel 315 or to at least one cooling plate 320 so that heat can be dispersed from these components. The cooling plates 320 can be part of the case 205, the bottom panel 305, or separate components attached to the case 205 or bottom panel 305. The fluid cooling channel 315 or cooling plates 320 can include heat sinks to wick or draw heat away from components of the power amplifier system 100.

In some implementations, the case 205 can include any of the power supply module 220 or other AC/DC power supply module, a computing device having a central processing unit and an RF or microwave digital synthesizer, the power amplifier system 100, a user interface such as a display having push buttons or other interfaces on a display panel to receive user input to control, for example frequency of the input power signal 105 or the unified power output 187. The case 205 can include or be a shielded metal case that can shield the RF power circuitry of the power amplifier system 100 inside the case 205 proximate to an inner surface of the case 205 and that can define or provide the fluid cooling channel 315 proximate to an outer surface of the case 205. The case 205 can include interconnection circuits to, for example, reduce or minimize signal distortion. For example, interconnection circuits can reduce signal distortion at the isolator units 185 and close a control loop at the second power amplifier unit 160 by passing between an upper portion of the circuit and the bottom panel 305.

Figure 4:
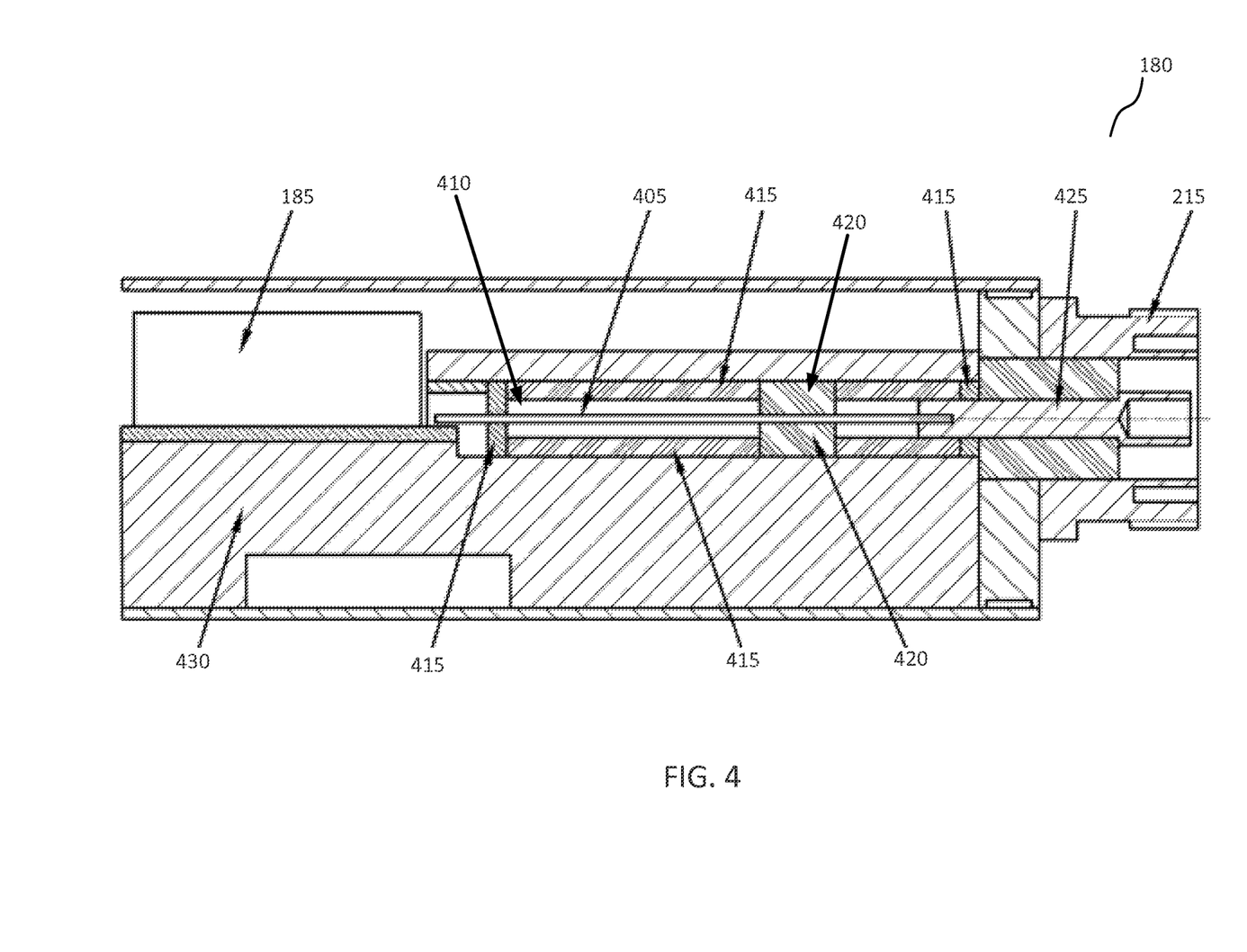
FIG. 4 depicts example components of a power amplifier system, including a power combiner unit, in accordance with at least one implementation.

FIG. 4 depicts an example power combiner unit 180 of the power amplifier system 100. The power combiner unit 180 can be disposed or installed at the output of the isolator unit 175 (or isolator device 185 thereof). The isolator devices 185 can be considered part of the power combiner unit 180 or separate from the power combiner unit 180. The power combiner unit 180 can combine together the four (or other number) of in phase (e.g., +/−5°) or substantially in phase (e.g., +/−25%) split power output signals 165 output from the second power amplifier unit 160, via for example the isolator unit 175, into a single unified power output 187 without introducing substantial phase shifting. The unified power output 187 can be provided from the power combiner unit 180 to the output connector 215. Referring to FIG. 1 and FIG. 4, among others, the power combiner unit 180 can include three two-in-one combiners, e.g., the first power combiner device 189, the second power combiner device 191, and the third power combiner device 193. The power combiner devices can be Wilkinson suspended line power combiners. For example, the power combiner unit 180 can include physical, suspended line conductors rather than a printed conductor of a printed circuit board. The thickness, length, and width of the power combiner devices 189, 191, 193 of the power combiner unit can provide impedance matching between the input and output to the power combiner unit 180 and power combiner devices thereof.

The power combiner unit 180 can carry or be subjected to stationary or standing wave power signals generated during, for example, a load mismatch condition. The standing wave can be the vectorial sum of forward and reverse power at the power combiner unit 180. A high RF voltage can be generated when, for example, the forward and reverse power signals are in phase. For example, the RF voltage can be 300 V under normal or targeted operating conditions but can rise to 1 kV during a mismatch condition between forward and reverse power signals.

The power combiner unit 180 can include at least one conductor 405. The conductor 405 can be made at least in part from copper. At least part of the conductor 405 can be suspended or fixed in at least one chamber 410. The chamber 410 can include air or another dielectric or dielectric gas (e.g., nitrogen). The conductor 405 can be held in position by at least one insulator 415. The insulator 415 can include polytetrafluoroethylene (PTFE) or a PTFE foil or sheet. In some implementations, the power combiner unit includes at least one PTFE element (e.g., insulator 415) at least partially defining the chamber 410, with the conductor at least in part disposed in the chamber 410. The insulator 415 can insulate the chamber 410. The suspended conductor 405 can, for example, withstand potential load mismatch or reverse power conditions. At least a portion of the conductor 405 suspended or disposed in the chamber can have at least one flat surface, or can be of other shapes such as curved or cylindrical. The power combiner unit 180 can also include at least one support structure 420 that can fix the conductor 405 in position. For example, the support structure 420 can include at least one cylinder made from or coated by a PTFE foil or sheet. The power combiner unit 180 can include at least one connector conductor 425. The connector conductor 425 can be made from a conductive material (e.g., one or more conductive metals) and can electrically couple the conductor 405 with the output connector 215. The power combiner unit 180 can include at least one cooling plate 430. The cooling plate (e.g., a heat sink) can ground the power combiner unit 180 and disperse heat from components thereof. The cooling plate 430 can be part of the case 205, e.g., part of the bottom panel 305, part of the fluid cooling channel 315. The cooling plate 430 can include one or more of the cooling plates 320 or can be independent and a separate element from the cooling plates 320.

The power combiner unit 180 can generally withstand electrical conditions caused by load mismatch or reverse power conditions and still generate the unified power output 187, e.g., without substantial phase shifting. The power combiner unit 180 can provide low losses due for example to the air dielectric in the chamber 410, and can also have high insulation relative to ground, due for example to the insulating properties of the insulator 415 and support structure 420. The chamber 410 can include air as a first dielectric and PTFE materials as a second dielectric (e.g., as part of the insulator 415 or the support structure 420). These dielectrics can minimize or prevent arcing that may occur between the conductor 405 and other components of the power combiner unit 180 due to the proximity of the conductor 405 and the wavelength of the RF power applied to (or passing through) the conductor 405 in the microwave frequency range of, for example, 2.45 GHz. In this example, the power combiner unit 180 and components such as the suspended conductor 405 in the chamber 410 can minimize or eliminate arcing and avoid substantial phase shifting when generating the unified power output 187 even at the smaller wavelengths associated with microwave frequency ranges, relative to the wavelength of lower frequencies. The power combiner devices 189, 191, 103 can have, for example, a length of 65 mm and a height of 10 mm, with the suspended conductor 405 suspended in the middle of the chamber 410. The power combiner unit 180 can fit in a footprint of the microwave generator unit 200 so that the width of the power combiner unit 180 is the same as the width of the power amplifier system 100 (minus the thickness of side walls or panels of the power amplifiers system 100). The distance between the conductor 405 and the cooling plate 430, which can act as a ground, can be, for example 4.5 mm.

In some implementations, the power combiner unit 180 combines power from multiple split power output signals 165 that is a fraction of a wavelength of the split power output signals 165 or of the unified power output 187. For example, a combining section of the power combiner unit 180 can include the portion of the conductor 405 suspended in the chamber 410. The combining section can have a length of substantially half of the wavelength of the split power output signals 165 or of the unified power output 187. In some implementations, the portion of the conductor 405 in the chamber 410 (e.g., the combining section) is a multiple of a quarter wavelength in air, ($\lambda/4$). The output impedance of the power combiner unit 180 (or of the unified power output 187) can be 50Ω or substantially 50Ω. In some implementations, the output impedance of the power combiner unit 180, (e.g., 50Ω) substantially matches (e.g., +/−25%) the output impedance of the first power amplifier unit 110, second power amplifier unit 160, or isolator unit 175.

The power combiner unit 180 can be subject to load mismatch conditions that increase the electric field stress to components of the power combiner unit 180. This stress may cause breakdown in the form of arcing, for example between the conductor 405 and other components of the power combiner unit 180 such as the cooling plate 430. To eliminate or minimize breakdown occurrences, due for example to reflected power the power combiner unit 180 can include a multiple dielectric configuration. For example, the chamber 410 can include a first dielectric (e.g., air or another gas) and a second dielectric, e.g., insulators 415 made from or covered by PTFE material. In some implementations, the electrical breakdown resistance of the second dielectric (e.g., PTFE material of the insulators 415) is greater than the electrical breakdown resistance of the first dielectric (air in the chamber 410).

Figure 5:
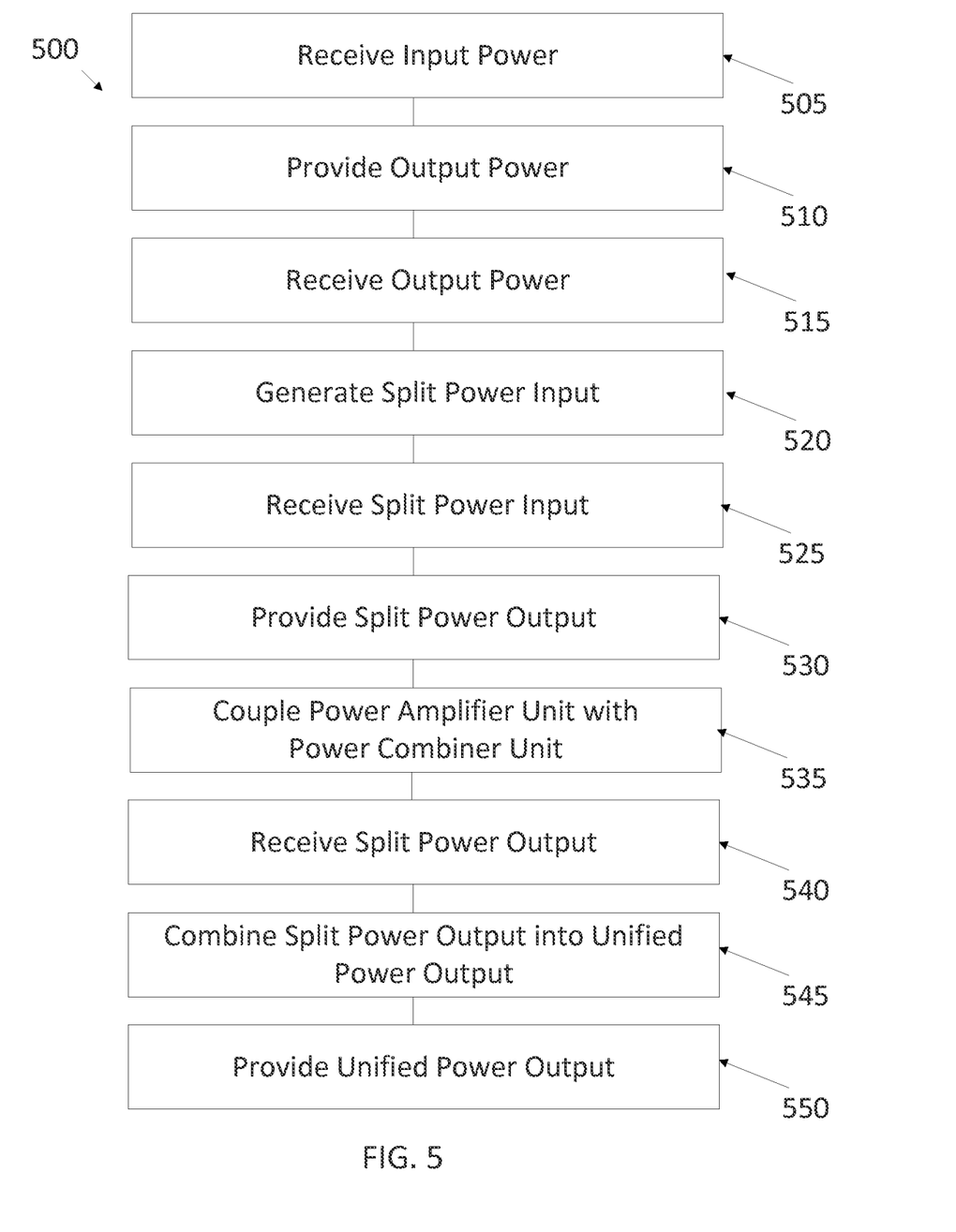
FIG. 5 depicts a method of providing microwave frequency range output power from a solid state power amplifier system, in accordance with at least one implementation.

FIG. 5 depicts a method 500 of providing microwave frequency range output power from a solid state power amplifier system such as the power amplifier system 100. For example, the solid state power amplifier system 100 can be provided in or with the case 205, which may include the fluid cooling channel 315. The method 500 can include receiving input power (ACT 505). For example, the first power amplifier unit 110 can receive (ACT 505) the input power signal 105 from the power supply module 220 via the input connector 210. The method 500 can include providing the output power signal 115 (ACT 510). For example, the first power amplifier unit 110 (or component thereof such as at least one power amplifier device 120) can provide the output power signal (ACT 510) to at least one power splitter unit 125. The method 500 can also include receiving the output power signal 115 (ACT 515). For example, the power splitter unit 125 or component thereof such as the first power splitter device 135 can receive (ACT 515) the output power signal 115 from the first power amplifier unit 110.

The method 500 can include generating at least one split power input signal 130 (ACT 520). For example, the power splitter unit 125 can generate (ACT 520) four (or other number) of split power input signals 130 from the output power signal 115. The method 500 can also include receiving at least one split power input signal 130 (ACT 525). For example, the second power amplifier unit 160 can receive (ACT 525) at least one (e.g., four) split power input signals 130. In some implementations, each one of a plurality of the power amplifiers 170 can receive (ACT 525) one of a plurality of split power input signals 130. The method 500 can include providing at least one split power output signal 165 (ACT 530). For example the second power amplifier unit 160 can provide as output (ACT 530) one or more split power output signals 165. In some implementations each power amplifier 170 can provide (ACT 530) one split power output signal 165. For example, the second power amplifier unit 160 can include four power amplifiers 170 in a parallel configuration, electrically coupled between at least one power splitter unit 125 and at least one isolator unit 175 that each provide as output (ACT 530) one or more split power output signals 165.

The method 500 can include coupling the second power amplifier unit 160 with at least one power combiner unit 180 (ACT 535). For example, at least one isolator unit 175 (or isolator device 185 thereof) can electrically couple (ACT 535) at least one of the plurality of power amplifiers 170 with the power combiner unit 180 or at least one power combiner device thereof. The method 500 can also include receiving at least one split power output signal 165 (ACT 540). For example, the power combiner unit 180 can receive (ACT 540) at least one (e.g., four) split power output signal(s) 165 from the second power amplifier unit 160 (or power amplifiers 170 thereof) via at least one isolator unit 175 (or isolator devices thereof). The method 500 can include combining the split power output signals 165 into at least one unified power output 187 (ACT 545). For example, the power combiner unit 180 can include at least one power combiner device such as the first power combiner device 189 that combined (ACT 545) at least two split power output signals 165 into a unified power output 187. The unified power output 187 can have a microwave frequency range (e.g., 2.0-3.0 GHz) and a power of at least 750 W (58.7 dBm). The method 500 can include an act of providing the unified power output 187 (ACT 550). For example, at least one of the power combiner unit 180, directional coupler 197, or output connector 215 can provide (ACT 550) the unified power output 187 as output from the power amplifier system 100 or from the microwave generator unit 200.

Thus, the power amplifier system 100 of the microwave generator unit 200 can include solid state devices to achieve a desired unified power output 187 of substantially 1 kW in the microwave frequency range of 2.4 GHz to 2.5 GHz by combining multiple split power output signals 165 without substantial or unacceptable losses due to phase shifts, without breakdown during mismatch conditions, with protection for components of the power amplifier system 100, and with a relatively high efficiency of at least 40%.

The microwave generator unit 200 including the power amplifier system 100 can include low power microwave devices in parallel (e.g., power amplifiers 170) to achieve 1 kW scale operation at a nominal frequency of 2450 MHz. The combining section of the power combiner unit 180 (e.g., the portion of the chamber 410 that includes the conductor 405) can achieve low loss and withstand electric field stresses associated with up to 100% reflected or back power. The power combiner unit 180 can include multi-material dielectric insulation (e.g., air and PTFE) to avoid breakdown with the combining section (or combining path) maintaining dimensions less than the microwave length or a fraction of the microwave length, such as one half, one fourth, or greater than one fourth of the microwave length.

While operations may be depicted in the drawings in a particular order, such operations are not required to be performed in the particular order shown or in sequential order, and all illustrated operations are not required to be performed. Actions described herein can be performed in a different order. The separation of various system components in the implementations described above should not be understood as requiring such separation in all implementations.

The terms "computing device" or "central processing unit" can encompass various apparatuses, devices, and machines for processing data, including by way of example a programmable processor, a computer, a system on a chip, or multiple ones, or combinations of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures. Processors suitable for the execution of a computer program can include general or special purpose microprocessors, and any one or more processors of any kind of digital computer. Generally, a processor will receive instructions and data from a read only memory or a random access memory or both. To provide for interaction with a user, the subject matter described herein can be implemented on a computing device (e.g., part of the microwave generator unit 200, having a display device, e.g., a monitor, for displaying information to the user and a control panel having interfaces (e.g., knobs, dials, or controls) by which the user can provide input to the computer of or associated with the microwave generator unit 200.

Having now described some illustrative implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements and features discussed in connection with one implementation are not intended to be excluded from a similar role in other implementations or implementations.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

Any references to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any information, act or element may include implementations where the act or element is based at least in part on any information, act, or element.

Any implementation disclosed herein may be combined with any other implementation or embodiment, and references to "an implementation," "some implementations," "an alternate implementation," "various implementations," "one implementation" or the like are not necessarily mutually exclusive and are intended to indicate that a particular feature, structure, or characteristic described in connection with the implementation may be included in at least one implementation or embodiment. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms.

Where technical features in the drawings, detailed description or any claim are followed by reference signs, the reference signs have been included to increase the intelligibility of the drawings, detailed description, and claims. Accordingly, neither the reference signs nor their absence have any limiting effect on the scope of any claim elements.

The systems and methods described herein may be embodied in other specific forms without departing from the characteristics thereof. For example, the second power amplifier unit 160 may include six or eight, rather than four, power amplifiers 170. The foregoing implementations are illustrative rather than limiting of the described systems and methods. Scope of the systems and methods described herein is thus indicated by the appended claims, rather than the foregoing description, and changes that come within the meaning and range of equivalency of the claims are embraced therein.

What is claimed is:

1. A power amplifier system, comprising:
   a first power amplifier unit to receive an input power signal and provide an output power signal, the output power signal having higher power than the input power signal;
   a power splitter unit to receive the output power signal from the first power amplifier unit and to generate a plurality of split power input signals, each of the plurality of split power input signals in-phase with one another;
   a second power amplifier unit to receive the plurality of split power input signals, each of the plurality of split power input signals in-phase with one another, the second power amplifier unit including a plurality of power amplifiers, each of the plurality of power amplifiers of the second power amplifier unit configured to receive one of the plurality of split power input signals and to provide one of a plurality of split power output signals;
   at least one isolator unit to couple at least one of the plurality of power amplifiers of the second power amplifier unit with a power combiner unit; and
   the power combiner unit to receive the plurality of split power output signals from the second power amplifier unit via the at least one isolator unit and to combine the plurality of split power output signals into a unified power output of at least 800 W and having a frequency of between 2.0 GHz and 3.0 GHz.

2. The system of claim 1, comprising:
   a directional coupler configured to receive the unified power output from the power combiner unit and to provide the unified power output as output of the power amplifier system.

3. The system of claim 1, comprising:
   the first power amplifier unit including three power amplifier devices.

4. The system of claim 1, wherein the first power amplifier unit comprises at least two power amplifiers connected to each other in series.

5. The system of claim 1, wherein the power amplifier system is part of a microwave generator.

6. The system of claim 1, wherein the power splitter unit includes a first power splitter device coupled to both a second power splitter device and a third power splitter device, comprising:
   the first power splitter device configured to receive the output power signal from the first power amplifier unit;
   the second power splitter device configured to provide a first of the plurality of split power output signals to a first of the plurality of power amplifiers of the second power amplifier unit, and to provide a second of the plurality of split power output signals to a second of the plurality of power amplifiers of the second power amplifier unit; and
   the third power splitter device configured to provide a third of the plurality of split power output signals to a third of the plurality of power amplifiers of the second power amplifier unit, and to provide a fourth of the plurality of split power output signals to a fourth of the plurality of power amplifiers of the second power amplifier unit.

7. The system of claim 1, wherein:
   the first power amplifier unit includes exactly three power amplifier devices configured in series;
   the power splitter unit includes exactly three power splitter devices;
   the second power amplifier unit includes exactly four power amplifiers configured in parallel;
   the at least one isolator unit includes exactly four isolator devices; and
   the power combiner unit includes exactly three power combiner devices.

8. The system of claim 1, comprising:
   the power amplifier system disposed in a shielded metal case, the shielded metal case having a fluid cooling channel.

9. The system of claim 1, wherein the unified power output has a frequency of between 2.40 GHz and 2.50 GHz.

10. The system of claim 1, wherein the plurality of split power output signals includes exactly four split power output signals that are substantially in phase with one another.

11. The system of claim 1, comprising:
    the power combiner unit including a polytetrafluoroethylene (PTFE) element at least partially defining a chamber; and
    a conductor element disposed at least in part in the chamber.

12. The system of claim 11, wherein the power combiner unit is electrically coupled with an output connector and the power combiner unit is disposed proximate to a cooling plate.

13. The system of claim 1, wherein:
    the first power amplifier unit receives the input power signal and provides the output power signal;

the power splitter unit receives the output power signal from the first power amplifier unit and generates the plurality of split power input signals;

the second power amplifier unit receives the plurality of split power input signals and provides the one of the plurality of split power output signals;

the at least one isolator unit couples the at least one of the plurality of power amplifiers of the second power amplifier unit with the power combiner unit; and the power combiner unit receives the plurality of split power output signals from the second power amplifier unit via the at least one isolator unit and combines the plurality of split power output signals into the unified power output.

14. The system of claim 1, wherein a combining section of the power combiner unit has a length of substantially half of a wavelength of any one of the plurality of split power input signals.

15. The system of claim 1, wherein the power combiner unit includes a chamber, the chamber including air as a first dielectric and a polytetrafluoroethylene (PTFE) element as a second dielectric.

16. A microwave generator unit comprising a power amplifier system, the power amplifier system comprising:
a first power amplifier unit to receive an input power signal and provide an output power signal;
a power splitter unit to receive the output power signal from the first power amplifier unit and to generate a plurality of substantially in-phase split power input signals, each of the plurality of split power input signals substantially in-phase with one another;
a second power amplifier unit having four power amplifiers to receive the plurality of substantially in-phase split power input signals, each of the four power amplifiers of the second power amplifier unit configured to receive one of the plurality of substantially in-phase split power input signals and to provide one of a plurality of split power output signals;
at least one isolator unit to couple at least one of the four power amplifiers of the second power amplifier unit with a power combiner unit; and
the power combiner unit to receive the plurality of split power output signals from the second power amplifier unit via the at least one isolator unit and to combine the plurality of split power output signals into a unified power output, the unified power output having a power of at least 750 W and a frequency of between 2.40 GHz and 2.50 GHz.

17. The microwave generator of claim 16, comprising:
a power supply module having a phase lock loop module configured to generate the input power signal, the first power amplifier unit configured to receive the input power signal from the phase lock loop module.

18. The microwave generator of claim 16, comprising:
a case having a fluid cooling channel;
a power supply module;
a user interface;
a RF digital synthesizer; and
a RF output socket.

19. A method of providing microwave frequency range output power from a solid state power amplifier system, comprising:
receiving, by a first power amplifier unit, an input power signal;
providing, by the first power amplifier unit, an output power signal, the output power signal having higher power than the input power signal;
receiving, by a power splitter unit, the output power signal from the first power amplifier unit;
generating, by the power splitter unit, a plurality of split power input signals each of the plurality of split power input signals in-phase with one another;
receiving, by a second power amplifier unit, the plurality of in-phase split power input signals, the second power amplifier unit including a plurality of power amplifiers, each of the plurality of power amplifiers of the second power amplifier unit configured to receive one of the plurality of in-phase split power input signals and to provide one of a plurality of split power output signals;
coupling, by at least one isolator unit, at least one of the plurality of power amplifiers of the second power amplifier unit with a power combiner unit;
receiving, by the power combiner unit, the plurality of split power output signals from the second power amplifier unit via the at least one isolator unit; and
combining, by the power combiner unit, the plurality of split power output signals into a unified power output of at least 750 W and having a frequency of between 2.0 GHz and 3.0 GHz.

20. The method of claim 19, comprising:
providing the unified power output as output from a microwave generator.

21. The method of claim 19, comprising:
providing the solid state power amplifier system in a case having a fluid cooling channel.

22. The method of claim 21, wherein the plurality of power amplifiers of the second power amplifier unit includes exactly four power amplifiers, comprising:
providing the four power amplifiers in a parallel configuration and electrically coupled between the power splitter unit and the at least one isolator unit.

* * * * *